United States Patent [19]
Hochstein

[11] Patent Number: 5,785,418
[45] Date of Patent: Jul. 28, 1998

[54] THERMALLY PROTECTED LED ARRAY

[76] Inventor: Peter A. Hochstein, 2966 River Valley Dr., Troy, Mich. 48098

[21] Appl. No.: 953,924

[22] Filed: Oct. 20, 1997

Related U.S. Application Data

[63] Continuation-in-part of Ser. No. 671,249, Jun. 27, 1996.

[51] Int. Cl.⁶ ............................................. F21Y 29/00
[52] U.S. Cl. ........................... 362/373; 362/294; 362/800
[58] Field of Search ................................. 362/227, 234, 362/235, 247, 294, 373, 800

[56] References Cited

U.S. PATENT DOCUMENTS

| | | |
|---|---|---|
| 4,729,076 | 3/1988 | Masami et al. . |
| 4,733,335 | 3/1988 | Serizawa .................... 362/373 |
| 5,038,255 | 8/1991 | Nishihashi et al. ............. 362/373 |
| 5,528,474 | 6/1996 | Roney et al. . |
| 5,632,551 | 5/1997 | Roney et al. . |
| 5,695,275 | 12/1997 | Markiewicz .................. 362/373 |

Primary Examiner—Thomas M. Sember
Attorney, Agent, or Firm—Howard & Howard

[57] ABSTRACT

An electrically driven L.E.D. lamp assembly (14) comprising an electrically insulating circuit board (26) having opposed first and second surfaces with light emitting diodes (28) having positive and negative leads (30, 32) mounted on the first surface. A plurality of pads (50) of thermally conductive plating are disposed on the second side with each pad (50) associated with the leads to conduct heat from each of the leads to one of the pads (50). A heat sink includes a base (36) overlying the second surface and layers (56, 58) of thermally conductive and electrically non-conductive material are disposed between the conductive plating and the heat sink (36) to secure the conductive plating and the circuit board (26) to the heat sink (36) while preventing a short between the conductive plating (50) and the heat sink (36). The assembly is characterized by a thermally insulating material (44) disposed over the heat sink (36) for sandwiching the heat sink against the conductive plating (50) to limit heat transfer into the heat sink from the outside.

11 Claims, 5 Drawing Sheets

THERMALLY PROTECTED LED ARRAY

RELATED APPLICATIONS

This application is a continuation-in-part of co-pending application Ser. No. 08/671,249 filed Jun. 27, 1996.

BACKGROUND OF THE INVENTION

1. Field of the Invention

The subject invention relates to light emitting diodes mounted in an array on a circuit board and, more particularly, to the dissipation of heat generated by the diodes. Such light emitting diode assemblies have particular utility in traffic signals and automotive lamps.

2. Description of the Prior Art

Newly developed light emitting diode traffic signals are exhibiting useful service lives that are much shorter than predicted. The expected life of such signals is at least five to seven years, but actual field experience with some of these devices demonstrates significant dimming of the L.E.D. after two years or less. The relatively high cost of the L.E.D. conversions suggests that a minimum three year life is necessary in order to amortize the acquisition cost. Energy savings, which can exceed eighty percent, are typically used to finance the conversion of incandescent lamps to the L.E.D. variants, in combination with the cost savings attributed to lower relamping expenses.

Both the purchasers and manufacturers of L.E.D. traffic signals seem to be puzzled by the relatively poor performance of the devices in the field. It is important to note that most L.E.D. component manufacturers predict lifetimes in excess of one hundred thousand hours. The widely divergent results observed in actual field experience vis a vis that observed in a laboratory environment suggests that the field operating conditions are very unlike those used to predict device lifetimes.

L.E.D.s are commonly rated at some nominal average operating current (20 mA) and temperature (typically 25° C.) for a given luminous output. Useful life is specified as the point in time (hours) at which the luminous output is half the initial value.

Recent experiments with a wide variety of L.E.D.s suggest an exponential relationship of life versus operating temperature. The well known Arhenius function is an approximate model for LED degradation: $D \propto te^{kT}$ where D is the degradation, t is time, e the base of natural logarithms, k an activation constant and T the absolute temperature in degrees Kelvin.

While this formulation is necessarily inexact, and is clearly device dependent, within a given L.E.D. family the empirical data can be modeled satisfactorily. The impact of this realization is dramatic. While room temperature (25° C.) lifetimes may in fact approach one hundred thousand hours, operation at close to 90° C. may reduce L.E.D. life to less than seven thousand hours.

Interestingly, neither users nor manufacturers of L.E.D.s specify operation of L.E.D. devices at temperatures approaching 90° C. Actual data collected in solar heating studies of traffic signals show that internal temperatures approaching 85° C. may be rather common in the U.S. Southwest. In fact, at ambient temperatures of 40° C. which are rather common, solar gain within the traffic signal housing can further increase the temperature nearly 30° C., without even operating the L.E.D. signals. The added thermal loading due to power supply losses and L.E.D. dissipation pushes the actual L.E.D. operating environment to temperatures in excess of 85° C. (185° F.) for at least a significant part of the day.

The problem of high internal temperatures is exacerbated in cases where L.E.D. lamps are intermixed with incandescent lamps. For example, if, in a given housing, only the red incandescent lamp is converted to an L.E.D. lamp, and the amber and green incandescent lamps are retained, the heat generated by the illuminated incandescent lamps will greatly increase the temperature surrounding the L.E.D. lamp.

Obviously, venting the L.E.D. traffic lamp assembly or module into the sealed traffic signal housing, is futile. Rejecting heat into an environment of higher temperature than that of the source is thermodynamically impossible. The key to improving the life of the L.E.D.s in traffic signal service is to reduce the temperature of the L.E.D. environment. Note that little can be done to modify the "ambient" temperature which is the normal surrounding air temperature.

U.S. Pat. No. 4,729,076 to Masami et al strives to lower the temperature of the LED array by attaching a finned heat sink assembly. However, there is a choke or restrictor in the path of the heat from the light emitting diodes to the heat sink; to wit, a resin filler or adhesive which is a very poor heat conductor. The Masami '076 patent recognizes the problem of positioning the heat sink within the traffic signal housing where it must exchange heat with the air within the housing. As noted in the Masami '076 patent, some means of ventilation must be provided by vents, louvers, fans or the like, when the heat sink is within the housing. Such provisions are not particularly effective in hot climates, and they subject the signal to dirt and moisture infiltration. Since the lens, reflector and lamp assembly is not separately sealed in traditional housings, moisture or dust that enters a conventional signal housing may degrade the optical performance of the unit and cause corrosion of exposed electrical components. Experiments with baffled vents suggest that substantial (size) openings at the bottom and top of the traffic signal housing would be necessary to provide unimpeded (low back pressure) air flow through the housing. Clearly, retrofitting LED lamps into existing traffic signal housings that do not have venting provisions is futile, because of heat loading. Field modification of existing housings to provide adequate venting is costly, time consuming and of limited utility because of the size of openings that are necessary. To overcome this venting problem, the Masami '076 patent suggests placing the heat sink on the back of the housing and exposed to ambient air with a heat conduit to transfer heat from the LEDs to the heat sink. Again, field modification of existing housings to mount a heat sink on the back of the housing is costly, time consuming and of limited utility because there still remains the restriction or choke of heat transfer from the LEDs to the heat sink.

Thermal stressing of the LEDs is typically due to environmental factors such as solar heating and the self generated heat of the LEDs during normal operation. Currently available, large arrays of LEDs, particularly those with high packing density, such as traffic signals and message displays, may exhibit a self induced temperature rise of 25° C. to 35° C.

In many applications for LED signals, the environmental heating factors predominate, and self generated heat is but a small fraction of the total thermal load. In traffic signal applications for example, the LED array may have to operate within a signal housing that may reach 85° C. interior temperatures. Such high internal stagnation temperatures are due to solar heat loads, an essentially sealed enclosure and the use of an absorbing plastic housing. Note that the normal operating temperature rise would typically be added to the temperature induced by solar loading, yielding effective LED temperatures in the 110° C. range. At such temperatures, not only will the LEDs be dimmed to a fraction of their starting luminous intensity, but the longevity of the signal will be drastically shortened. Needless to say, dramatic dimming of a safety critical device such as a (red) traffic signal can have undesired effects, while the early attrition of such signals suggests a negative cost-benefit situation for the municipal entity.

Masami, et al. in U.S. Pat. No. 4,729,076 discloses a heat sink adapted to an LED traffic signal. The intent of the inventor is clearly to extract heat from the enclosed LED array and to reject heat to a lower temperature ambient. In fact, as discussed earlier, the operating environment for the LED signal module may be substantially higher in temperature than the LED array itself. That is, when operated within a traffic signal housing, the LEDs would be subject to high internal temperatures due to solar loads. Addition of passive vents, which reduce the stagnation temperature within the housing, may do little to ameliorate the over temperature condition in certain geographic regions because of the very high solar loads. Powered vents using fans as disclosed by Masami are not practical because of reliability concerns and the induction of dust and moisture into the signal housing.

Attachment of a direct or indirect radiator to the LED array as shown by Masami is unsatisfactory because such radiators only behave as heat sinks if their temperature is lower than that of the LED array. If the radiator assembly is heated by solar radiation, it becomes an energy absorber and it couples damaging heat into the LED array rather than out of the array. It should be understood that thermally coupled systems act bilaterally, and will always transfer heat from the higher temperature component to that at a lower temperature.

Similarly, the "LED Vehicle Lamp Assembly" disclosed in U.S. Pat. Nos. 5,528,474 and 5,632,551 to Roney, et al. incorporates an LED array thermally coupled to a thermally conductive housing. The intent of the inventors was to couple self generated LED heat out of the array and into ambient by means of the metal casing and integral mounting flange. Unfortunately, in a vehicular environment, solar heating of various exterior components may result in operating temperatures exceeding 85° C., as noted in "S.A.E. Ground Vehicle Lighting Standards Manual" HS-34, 1997 Edition, published by the Society of Automotive Engineers, Inc., Warrendale, Pa. 15096. These high temperatures are primarily due to absorbance of direct sunlight, and in some cases by heat trapped in glass or plastic covered spaces.

Thermal stress that is applied to LED signals in an outdoor environment is primarily due to solar exposure. A relatively small fraction of total heat load is due to LED operation. While this energy balance may appear to be counterintuitive, calculation and testing clearly shows the effect of solar exposure. A standard 300 mm (12 inch), black, polycarbonate traffic signal housing has an exposed outer surface of approximately 0.55 $m^2$, which when exposed to a solar flux of 1000 Watts/$m^2$, will absorb nearly 500 Watts. Compared to the 20 Watt dissipation of an LED signal operating within such a module, the environmental stress is obviously the predominant concern. As noted earlier, the actual temperature within such housings is often above 85° C. Trying to dissipate heat from an LED signal module into such a high temperature environment is impossible and, in fact, heat flows in the opposite direction; that is, from the elevated ambient surrounding the device into the LED signal housing. Given the high thermal conductivity housings disclosed in the prior art, the deleterious heat transfer from an elevated ambient into the LED array is actually maximized, thereby overheating the LEDs; dimming them; and shortening the life of the devices.

SUMMARY OF THE INVENTION AND ADVANTAGES

An electrically driven L.E.D. lamp assembly comprising an electrically insulating circuit board having opposed first and second surfaces with light emitting diodes having positive and negative leads mounted on the first surface and a thermally conductive plating on the second surface. The conductive plating is thermally connected to the leads to conduct heat from the leads to the conductive plating and a heat sink overlies the conductive plating, with a thermally conductive layer disposed between the conductive plating and the heat sink to secure the conductive plating and the board to the heat sink. The assembly is characterized by a thermally insulating material disposed over the heat sink for sandwiching the heat sink against the conductive plating to limit heat transfer to the heat sink.

Accordingly, the present invention provides a directionally selective heat sink and dissipator which enhances dissipation of heat from an LED array to the surrounding air, but retards heat flow into the LED array from high temperature sources such as solar heated air or from direct solar radiation.

The improvements to the operating conditions for typical LED signals afforded by the present invention are significant; rather than operating in 85° C. (185° F.) ambient, the LED array can typically operate at 41° C. (106° F.).

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE PREFERRED EMBODIMENT

Figure 1:
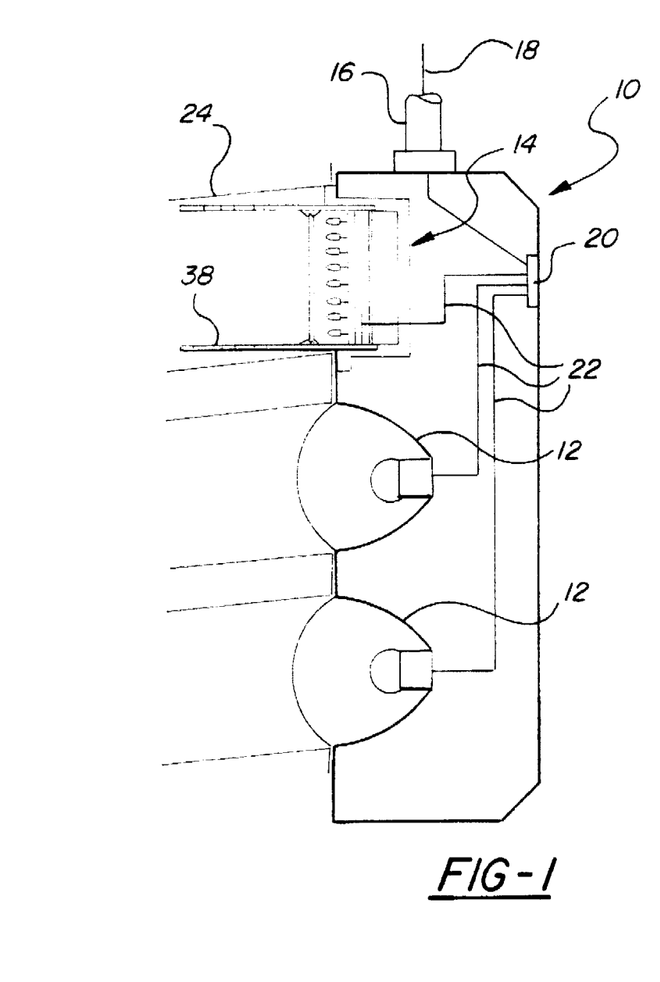
FIG. 1 is a cross sectional view of a traffic light enclosure with the prior art incandescent lamp in two of the openings and a preferred embodiment of the subject invention mounted in the upper opening.

Referring to the Figures, wherein like numerals indicate like or corresponding parts throughout the several views, a traffic light housing is indicated at 10 in FIG. 1. Conventional incandescent lights 12 are mounted in the housing 10.

In addition an electrically driven light emitting diode (L.E.D.) lamp assembly, constructed in accordance with the subject invention and generally indicated at 14, is also mounted in the housing 10. The traffic light housing 10 is hung by a hanger 16 through which an electrical power line 18 leads to a terminal block 20. Respective leads 22 transfer electrical power to each of the lamp assemblies 12 and 14. Conventional sun hoods 24 extend forwardly about the opening in the housing in which the lamp assemblies are mounted.

Figure 2:
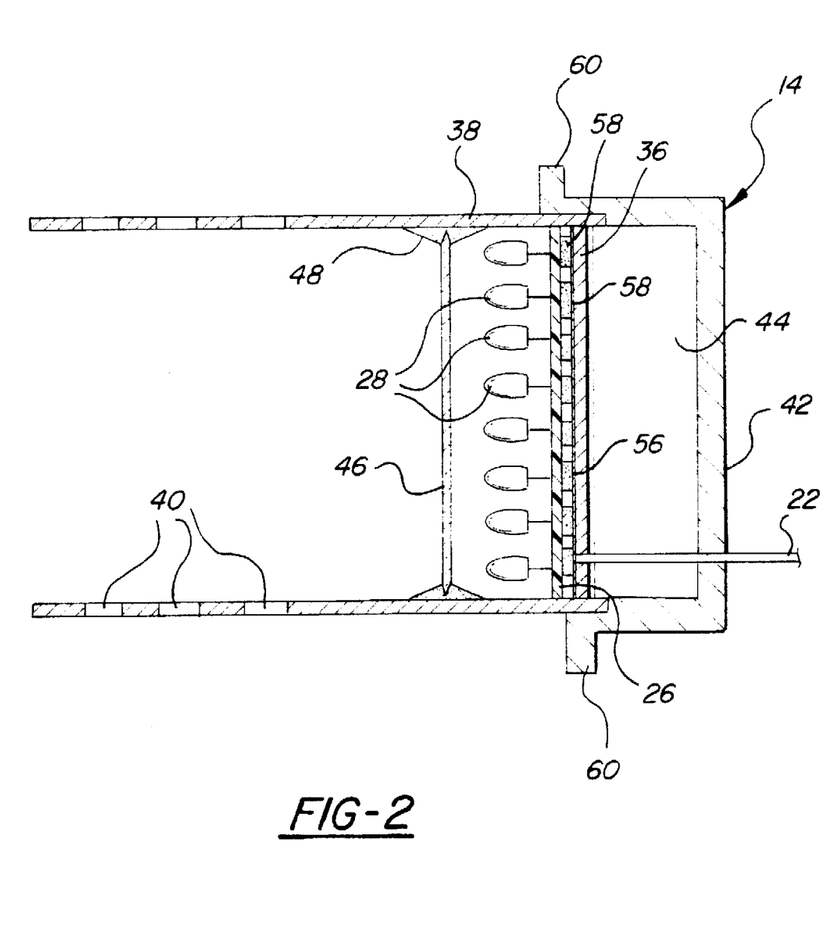
FIG. 2 is a cross section view of a preferred embodiment of the subject invention.

One embodiment of the electrically driven L.E.D. lamp assembly 14 is best shown in FIG. 2 and comprises an electrically insulating circuit board 26 having opposed first and second surfaces with light emitting diodes 28 having leads 30 and 32 positive and negative) mounted on the first surface and an electrically conductive plating on the first surface for establishing discrete and electrically conductive paths 34 for electrically interconnecting the positive lead 30 of one the light emitting diodes 28 to the negative lead 32 of another of the light emitting diodes 28.

A heat sink includes a base 36 overlying the second or back surface of the circuit board and a shell 38 extending forwardly from the base 36 in front of the light emitting diodes 28 for conducting heat to the light emitting side of the assembly. In other words, the shell 38 conducts heat from the LEDs of the back side of the circuit board to the ambient air within the sun hood 24, it being important that the shell 38 be spaced radially from the sun hood 24 to allow the free circulation of air and to prevent the transfer of heat from the hood 24 to the shell 38. To increase heat transfer, the shell 38 may include perforations 40 therein to allow for air passage and increase the surface area for radiating heat. The shell 38 may be shortened to extend only to a transparent cover 46 when maximum heat dissipation is not required.

Figure 8:
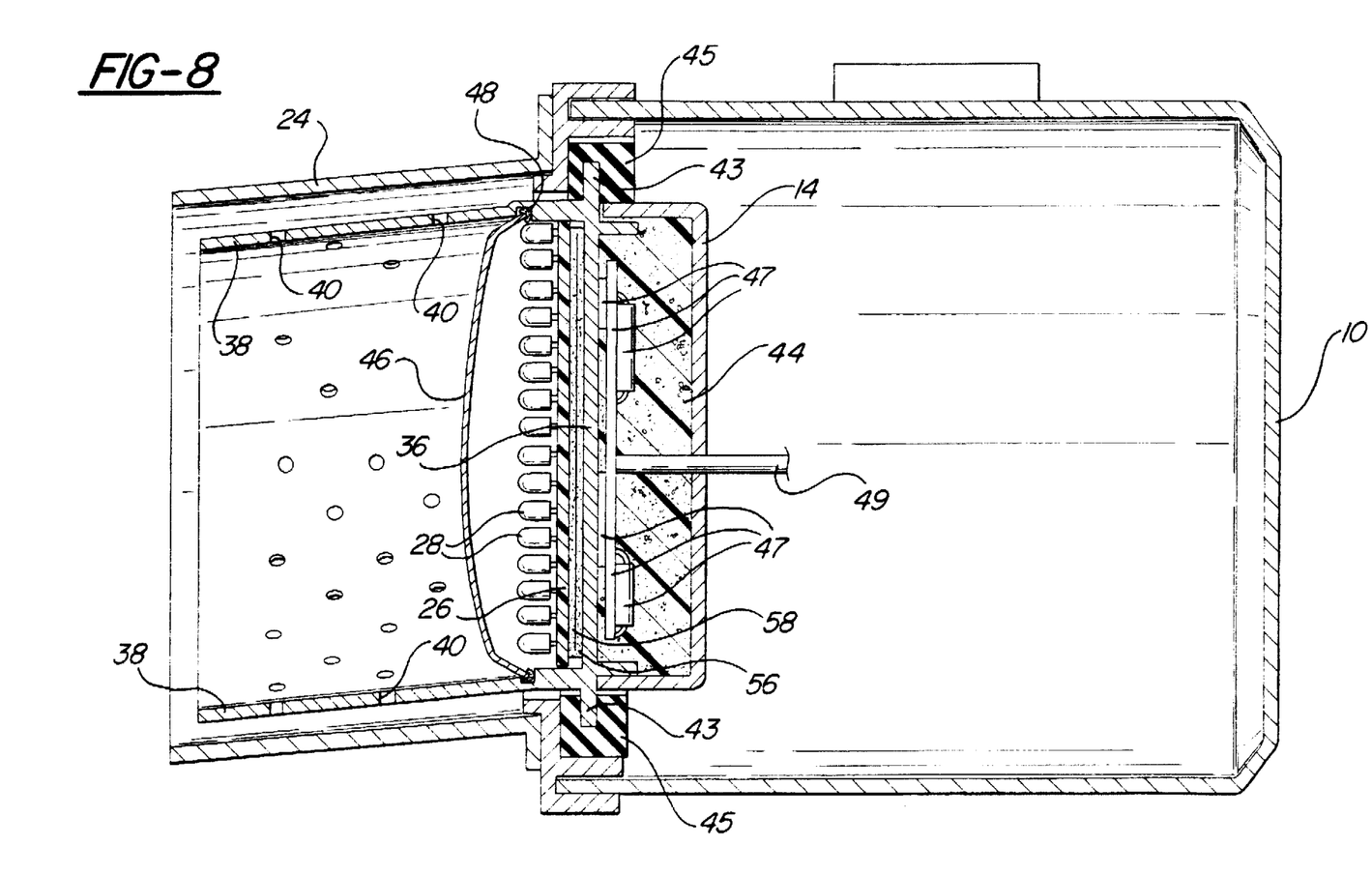
FIG. 8 is a cross sectional view of an entire assembly.

A casing 42 surrounds the base 36 of the heat sink and insulating material 44 is disposed between the base 36 and the casing 42 to limit heat transfer to the heat sink from outside the casing 42, i.e., from sources other than the LEDs 28. A transparent cover 46 is retained within the shell 38 by a weather seal 48. As more specifically shown in FIG. 8, a thermally conductive layer, which is actually made up of the layers 58 and 56, is disposed between a conductive plating, comprising a plurality of pads 50, and the heat sink 36 to secure the conductive plating 50 and the circuit board 26 to one side of the heat sink 36 while a thermally insulating material 44 is disposed over the other side of the heat sink 36 for sandwiching the heat sink 36 against the conductive plating 50 to limit heat transfer to the heat sink 36 from the ambient surroundings. The casing 14 defines a heat shield surrounding the thermally insulating material 44 to act as an additional barrier to heat transfer into the heat sink 36. The thermally insulating material 44 is of a low thermal conductivity such as a resinous foam, fibrous filler or trapped air may be used to surround the heat sink 36.

The shell 38 of the heat sink 36 acts as a heat dissipator portion extending away from the insulating material 44 to convey heat from the conductive plating 50. The shell 38 extends forwardly of the light emitting diodes 28 and within and circumferentially spaced from the sun hood 24 whereby the shell 38 may present a larger surface area than the base 36 of the heat sink. The heat sink may be fabricated of aluminum, copper or an alloy and may be coated or treated to provide high emissivity. The housing 10 supports a flange 43 extending radially by a gasket 45 surrounding the flange to isolate the heat sink 36 from the housing 10, as the housing 10 also defines a space around the heat shield 14. Instead of being a traffic light, the housing 10 may be defined by a portion of a vehicle body surrounding a tail light, or the like. As alluded to above, the shell 38 may include perforations 40 therein for radiating heat, i.e., the perforations increase the surface area exposed to ambient surroundings for enhancing heat dissipation.

A combination of power supply components 47 are disposed on the other side of the heat sink 36 and within the insulating material 44 with an electrical lead 49 for supplying electrical power.

Figure 3:
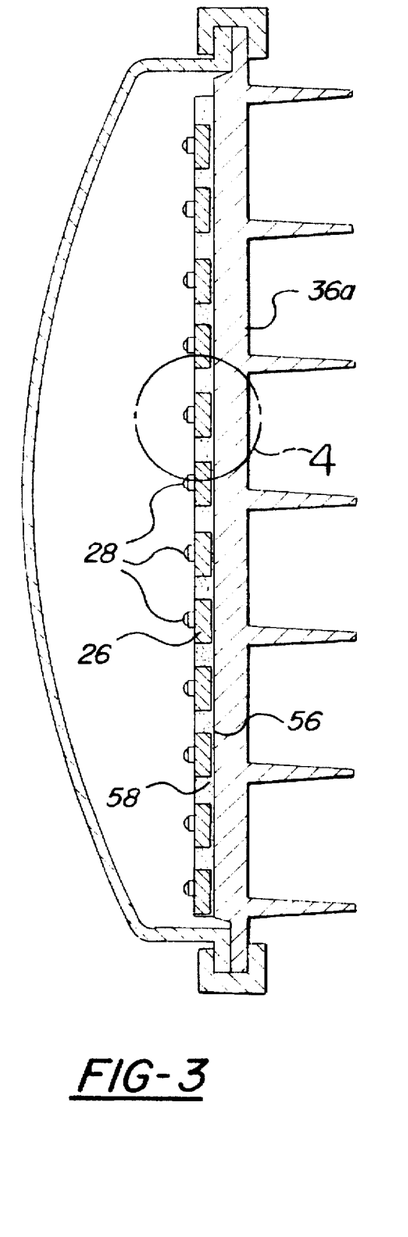
FIG. 3 is a cross sectional view of a second embodiment.
Figure 4:
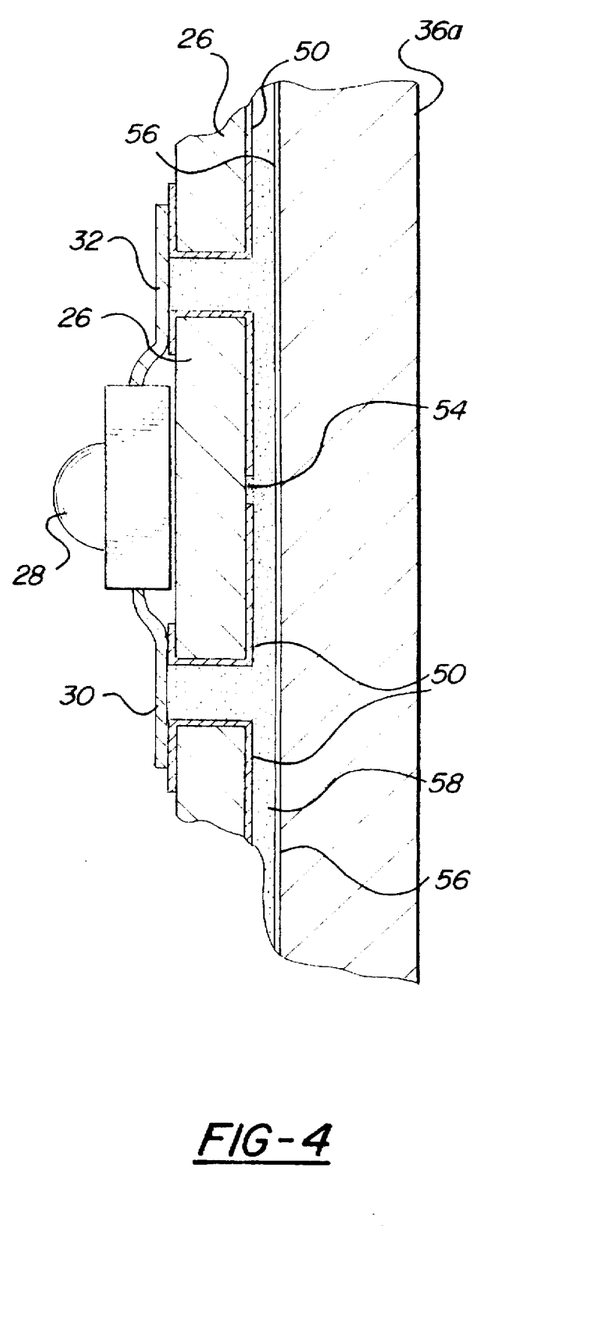
FIG. 4 is an enlarged cross sectional view of a portion of FIG. 3.
Figure 5:
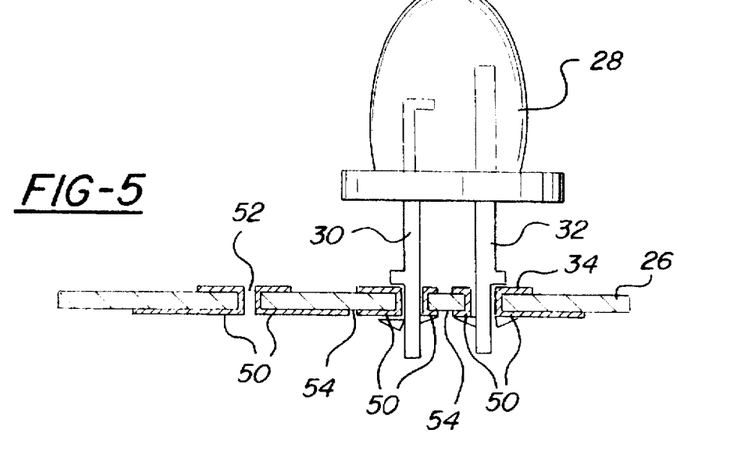
FIG. 5 is an enlarged fragmentary cross sectional view of an LED with leads extending through the board.
Figure 6:
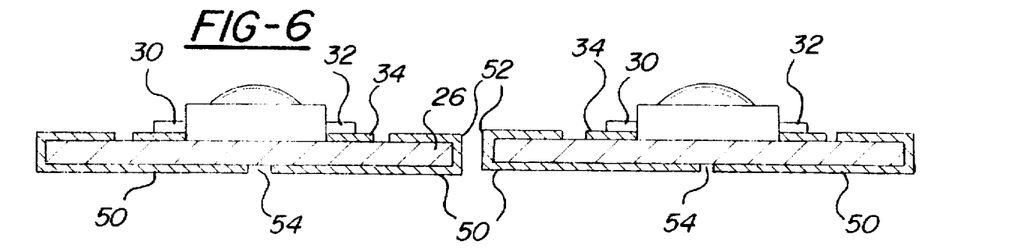
FIG. 6 is an enlarged fragmentary cross sectional view of and LED surface mounted on the board.

In order to increase the transfer of heat from the circuit board 26 to the heat sink, whether it be the improved heat sink base 36 and shell 38 or the conventional heat sink 36(a) shown in FIGS. 3 and 4, the electrically insulating circuit board 26 has a plurality of holes extending therethrough with the plurality of pads 50 of thermally conductive plating on the second side each associated with one of the holes. In some instances the holes may be the holes through which the LED leads 30 and 32 extend with each of the lead holes providing thermal conductivity to one of the pads 50. In addition to the lead holes for the leads 30 and 32, there may be included a plurality of holes 52 dispersed among the lead holes, as shown in FIG. 5. As a simplification of the structure shown in FIG. 5, the pads 50 may be disposed only on the second surface of the circuit board without any conductive plating on the first surface, i.e., no paths 34. In the case of surface mounted LEDs, the LED leads 30 and 32 may extend over the lead holes as shown in FIG. 4 or there are no lead holes and only the through holes 52 are provided as shown in FIG. 6. In all cases the plating material is homogeneous, that is, the electrical paths 34 between LED leads 30 and 32 are integral with and are an extension of the pads 50 by extending through the lead holes and the specially provided holes 52. Accordingly, heat is transferred from the leads 30 and 32 through the plating as it continues through the holes and into the pads 50.

Figure 7:
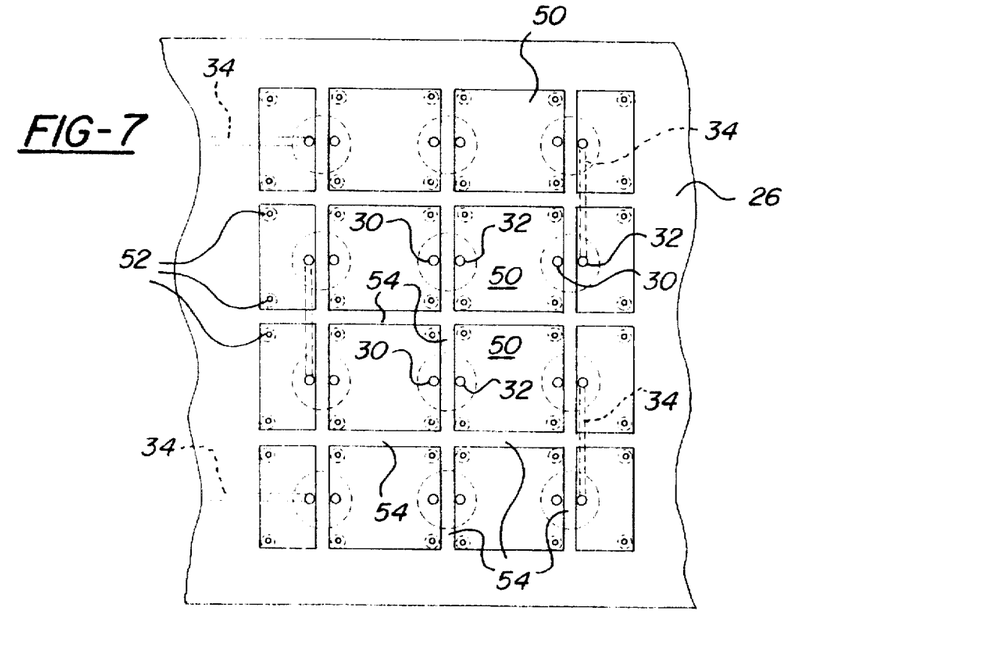
FIG. 7 is a fragmentary plan view of the second side of the board showing the thermal pads.

The pads 50 extend laterally from the holes and are separated from one another a discrete distance 54 which is only of a magnitude sufficient to prevent electrical conductivity from pad to pad. Therefore, the thermally conductive material extends through the holes and thermally connects each of the pads 50 and one of the leads 30 or 32 to conduct heat from each of the leads to one of the pads 50 while maintaining electrical isolation between the pads 50 by the spaces 54 therebetween. The pads 50 are multi-sided, i.e., rectangular in area configuration and are separated by a grid of crossing lines 54 of separation, the lines 54 being in transverse groups with all the lines 54 in one group being parallel and at right angles to the lines 54 in the other group. It will be appreciated, however, the shapes of the pads 50 may vary, hexagonal being an efficient use of area.

In order to conduct as much heat as possible per unit of time the heat sink should overlay the pads 50 with minimal spacing therebetween while, at the same time preventing contact between the heat sink and the pads 50 to prevent electrical shorting between the pads 50. Accordingly, a thin layer 56 of electrically insulating material disposed between the pads 50 and the heat sink to prevent electrical shorting between the pads 50 by the flow of electrical current through the heat sink. An adhesive 58 secures the board 26 to the insulating layer 56. Without the insulating layer 56, the pads 50 could be pressed into engagement with the metal, preferably aluminum, heat sink 36 or 36(a). On the other hand, the adhesive 58 may itself comprise the electrically insulating but heat conductive layer to both secure the board 26 and pads 50 to the heat sink 36 or 36(a). In other words, the adhesive layer 58 could be used without the electrically insulating layer 56 so long as the pads are maintained in spaced non-conductive relationship with the heat sink, or both the adhesive 58 and the insulating layer 56 could be laminated together.

The majority of the area, which is occupied by the pads 50, the holes (lead holes and additional holes 52) and the discrete distances 54, on said second side of the board is taken up by the pads 50. In other words, the pads 50 occupy the majority of the area of the bottom of the board 26, i.e., only enough space is devoted to the discrete nonconductive distances to prevent electrical shorting. Clearly, the majority is over eighty percent.

As noted, some traffic signal housings may reach internal temperatures of 90° C. (195° F.) in high solar loading conditions. While venting the housing is certainly possible, the necessity for substantial field work on the housing may be costly and inconvenient. Accordingly, this invention provides other means of rejecting LED heat to the environment (surrounding air). Instead of trying to reject heat into the traffic signal housing which may in fact be at a higher temperature than the LED assembly itself, one aspect of the present invention is to facilitate rejection of heat through the front of the signal housing, around the lens opening.

As shown in FIG. 2, the LED lamp 28 array is enclosed in a thermally conductive metal tube or cylindrical shell 38 which can conduct heat from the base or bottom 36 along the side walls of the shell 38 to outside ambient air. That is, instead of trying to reject heat to the air within the traffic signal housing, heat is directly rejected to outside air. The use of a cylindrical heat sink with an integral (flat) bottom 36 as shown, allows for efficient coupling of the LED mounting substrate or circuit board 26 to the enclosure base 36 by means of a thermally conductive (loaded) epoxy 58. While optimal, such coupling may not be necessary in all cases, and thermal exchange by means of the heated air would suffice. Added thermal coupling between the walls 38 of the metallic cup and the heated air will further improve heat dissipation of the LED array. In most cases, traffic signals are equipped with shading hoods 24 to improve signal visibility. These hoods 24 are commonly canted at about 7½° to the horizon, and effectively keep direct sunlight out of the signal lens. The proposed metal heat sink 36 and 38, which is preferably fabricated of drawn, spun aluminum or die cast aluminum, fits within the hood 24. A small air space between the outer hood 24 and inner tubular shell 38 keeps thermal coupling between these two components at a minimum. The outer hood 24 is usually exposed to direct sunlight and can get much hotter than the surrounding air.

The small perforations 40 in the shell 38, outside the sealed region of the LED lamp will prevent thermal stagnation of air trapped between the two tubular sections. A blackened interior cylindrical surface may be provided to enhance contrast (currently common practice) and improve emissivity. Since the base 36 of the cylindrical shell is thermally conductive, heat from the interior of the signal housing 10 could be added to the LED lamp 14 unless insulation is provided at the base of the LED housing. A simple plastic cover 42 with an air space or thermal insulation material 44 will effectively thermally decouple the signal housing 10 from the LED signal lamp 14. Provisions for mounting the LED lamp 14 in standard housings 10 could be accommodated by merely including a flange 60 on the outer diameter of the rear casing 42. Note that the use of existing sun hoods 24 prevents direct solar heating of the aluminum shell 38, which would add significant heat to the LED array.

The transparent, clear or tinted front cover 46 could be inserted in the tubular shell 38 to seal the LED lamp 14 against moisture and dust. Lenses, prisms or other beam steering optics could be incorporated into the front cover 36 or alternatively be added as a separate optical assembly. Compliant sealing agents such as various elastomers, plastics or epoxies could be used to mount the front cover 46 to the tubular shell 38 for sealing and to allow for differential thermal expansion between the plastic and metal elements, which are exposed to a wide range of operating temperatures.

In order to accommodate the nominal 7½° canted sun hoods 24, the LED lamp assembly 14, including the tubular shell 38, could be similarly canted by the mounting flange 60. Since virtually all properly designed signals exhibit an asymmetric optical pattern, the unique canted configuration ensures that the signal will be correctly installed in the housing. That is, the LED lamp 14 cannot be mounted out of position because the canted tubular shell 38 would physically interfere with the sun hood 24.

In colder regions, blown snow can effectively obscure signals, leading to potentially dangerous situations. Heat conducted along the tubular heat sink will help melt any snow that accumulates in the signal opening.

The other feature of the present invention is the enhanced thermal dissipation from the LEDs as they are mounted onto a thermally conductive heat sink. As noted, a thermally conductive coupling agent 58 such as a filled epoxy or resin may be used to transfer heat from the LED array and circuit board 26 to the metallic heat sink 36, 36(a). However, the best thermally conductive, electrically insulative compounds exhibit heat transfer coefficients that are orders of magnitude lower than most metals. To remedy this situation, the LED leads 30 and 32 are soldered or bonded to the respective conductive pads 50 on the circuit substrate 26 (printed circuit board) in a manner so as to maximize the thermal transfer from the LED component leads 30 and 32 to the conductive pads 50.

Commonly, circuit boards are designed with small isolated pads or islands of copper on the supporting substrate. The necessary circuitry interconnects and/or isolates the various components as required. Plated through holes or vias generally interconnect the conductor pattern or paths 34 on one side to the other side of the board for electrical continuity.

A very beneficial improvement in heat extraction from the LEDs 28 to the substrate 26 and from the substrate to the heat sink 36, 36(a) is achieved by this modification of standard circuit board practice. As shown in FIGS. 2, 5 and 6, a standard circuit board 26 is provided with double sided copper plating. The first side is configured with the necessary interconnection lines or paths 34 and component connectors, while the second side, the side mounted against the conductive heat sink, is etched to retain virtually all the copper cladding, as is shown in FIG. 7. In order to retain component isolation, fine openings or isolation traces 54 are etched into this heat spreader layer. The function of these large conductive pads (copper) 50 is to act as heat spreaders that take the heat from the LED leads 30 and 32 and dissipate it to the mounting surface of the substrate where it can be driven into the thermally conductive heat sink 36, 36(a). A large number of plated through holes are used to interconnect the topmost and the bottom layer. That is, plated through holes that are normally used only for electrical coupling are used for thermal coupling. A typical enhanced thermal dissipation LED assembly will have many more unoccupied (component-less) holes 52 in addition to the holes filled with the leads 30 and 32 of the active components. An additional benefit of these "extra" holes 52 is the ability of the thermal bonding compound (resin) 58 to partly fill the holes 52 and improve physical attachment, while enhancing thermal transfer, to the thermally conductive heat sink 36, 36(a).

Figure 9:
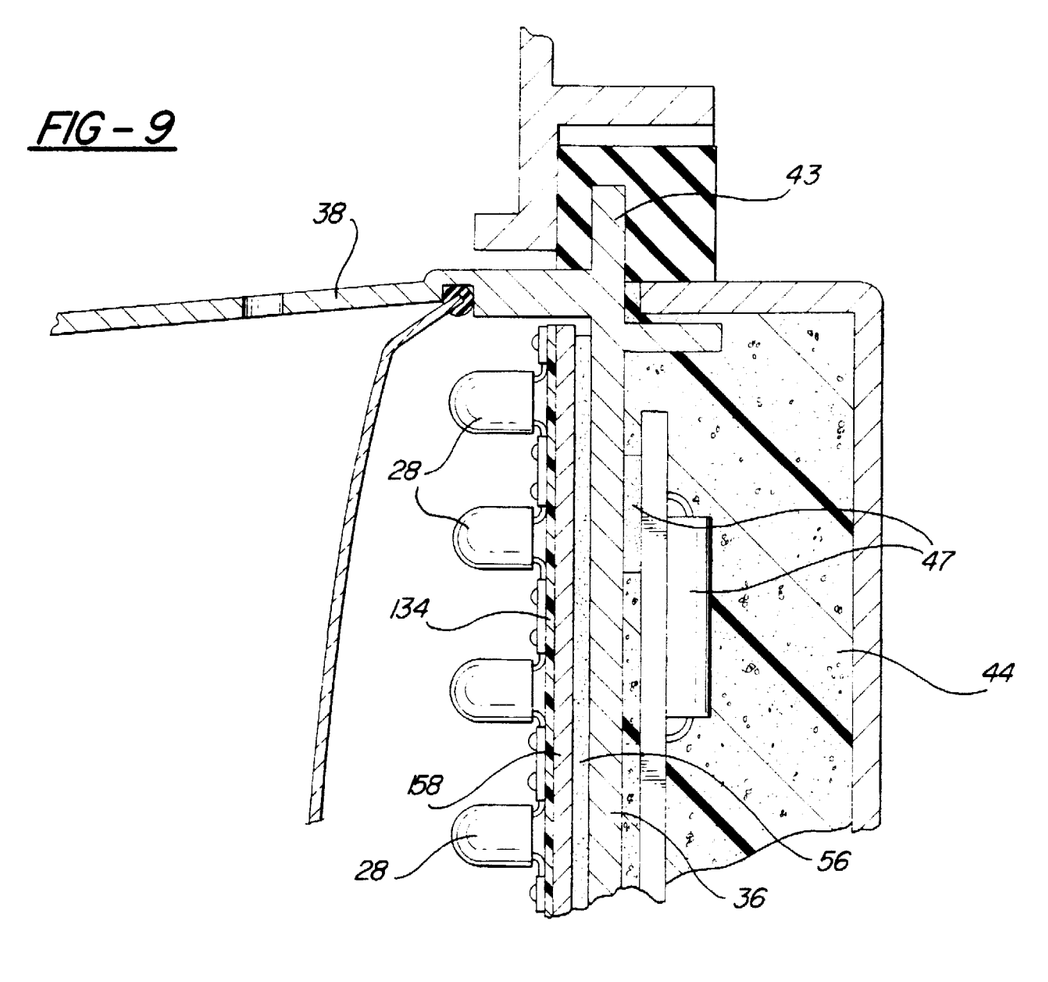
FIG. 9 is a fragmentary cross sectional view similar to FIG. 8 but showing an alternative LED circuit combination.

The embodiment of FIG. 9 includes the same components as indicated with like numerals, but differs in the mounting of the LEDs. In this embodiment of FIG. 9, the leads of the LEDs are electrically connected by an electrically conductive adhesive 134 which is isolated from an aluminum or metal substrate 126 by a thermally conductive and electrically insulating layer 158 on the aluminum substrate 126. The electrically insulating means or coating 56 is disposed over a first face of the heat sink 36 to insulate the aluminum substrate 126 from the heat sink. An electrically conductive circuit is disposed on the insulating layer 158 and an electrically conductive adhesive 134 connecting the leads to the circuit.

Therefore, the subject invention is useful with various embodiments of a heat sink 36 having first and second faces and an array of light emitting diodes 28 disposed over the first face of the heat sink 36, with each of the light emitting diodes 28 having positive and negative leads and an electrically conductive circuit interconnecting the leads. An electrically insulating means is included for electrically insulating the conductive circuit and the light emitting diodes from the first face of the heat sink 36. In any combination of circuit electrically isolated from but thermally coupled to the heat sink, the assembly is characterized by a thermally insulating material 44 disposed over the second face of the heat sink 36 for limiting heat transfer to the heat sink from sources other than the light emitting diodes 28. Accordingly, heat from external sources is prevented from adding to the heat generated by the LEDs 28.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. An electrically driven L.E.D. lamp assembly comprising;

a heat sink having first and second faces, an array of light emitting diodes disposed over said first face of said heat sink, each of said light emitting diodes having positive and negative leads, an electrically conductive circuit interconnecting said leads, electrically insulating means for electrically insulating said conductive circuit and said light emitting diodes from said first face of said heat sink, said assembly characterized by a thermally insulating material disposed over said second face of said heat sink for limiting heat transfer to said heat sink from sources other than said light emitting diodes.

2. An assembly as set forth in claim 1 including a heat shield surrounding said thermally insulating material.

3. An assembly as set forth in claim 1 wherein said heat sink includes a heat dissipator portion extending away from said insulating material to convey heat from said conductive plating.

4. An assembly as set forth in claim 3 including a housing supporting said heat sink.

5. An assembly as set forth in claim 4 wherein said housing defines a space around said heat shield.

6. An assembly as set forth in claim 5 including a gasket supporting said heat sink in said housing.

7. An assembly as set forth in claim 6 wherein said housing comprises a traffic light housing presenting a light emitting opening and a sun hood extending from said opening, said heat dissipator portion comprising a shell extending forwardly of said light emitting diodes, said shell extending from said opening within and spaced from said sun hood.

8. An assembly as set forth in claim 7 wherein said shell includes perforations therein for radiating heat.

9. An assembly as set forth in claim 8 including an electrically insulating circuit board having opposed first and second surfaces, said light emitting diodes mounted on said first surface, a thermally conductive plating on said second surface, said conductive plating being thermally connected to said leads to conduct heat from said leads to said conductive plating, said first face of said heat sink overlying said conductive plating, said electrically insulating means comprising a thermally conductive layer disposed between said conductive plating and said first face of said heat sink to secure said conductive plating and said board to said first face of said heat sink, said conductive plating comprising a plurality of pads disposed on said second surface of said circuit board, said thermally conductive material comprising an adhesive layer of electrically insulating adhesive disposed between said pads and said first face of said heat sink, and a second electrically insulating material for preventing the adhesive from being thin enough to cause electrical shorting.

10. An assembly as set forth in claim 8 wherein said electrically insulating means comprises a coating disposed over said first face of said heat sink, said electrically conductive circuit disposed on said coating, and an electrically conductive adhesive connecting said leads to said circuit.

11. An assembly as set forth in claim 8 wherein said electrically insulating means comprises a coating disposed over said first face of said heat sink, a metal substrate disposed over said coating, a thermally conductive and electrically insulating layer on said substrate, said electrically conductive circuit disposed on said insulating layer, and an electrically conductive adhesive connecting said leads to said circuit.

* * * * *